(12) United States Patent
Yang

(10) Patent No.: US 8,370,727 B2
(45) Date of Patent: Feb. 5, 2013

(54) METHOD AND CIRCUIT FOR DECODING AN ERROR CORRECTION CODE

(75) Inventor: Tsung-Chieh Yang, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 913 days.

(21) Appl. No.: 12/479,833

(22) Filed: Jun. 7, 2009

(65) Prior Publication Data
US 2010/0199156 A1  Aug. 5, 2010

Related U.S. Application Data

(60) Provisional application No. 61/149,378, filed on Feb. 3, 2009.

(30) Foreign Application Priority Data

Apr. 9, 2009  (TW) ............................. 98111798 A

(51) Int. Cl.
*H03M 13/00* (2006.01)

(52) U.S. Cl. ........ 714/781; 714/782; 714/783; 714/784; 714/785

(58) Field of Classification Search ................. None
See application file for complete search history.

(56) References Cited

U.S. PATENT DOCUMENTS

| | | | | |
|---|---|---|---|---|
| 6,154,869 | A * | 11/2000 | Wolf ............................ | 714/784 |
| 6,192,497 | B1 * | 2/2001 | Yang et al. ................. | 714/781 |
| 6,374,383 | B1 * | 4/2002 | Weng ............................ | 714/781 |
| 7,590,923 | B1 * | 9/2009 | Kikuchi et al. .............. | 714/780 |
| 7,865,809 | B1 * | 1/2011 | Lee et al. ................... | 714/782 |
| 2006/0031742 | A1 * | 2/2006 | Fukuoka et al. ............. | 714/784 |
| 2006/0089792 | A1 | 4/2006 | Manber et al. | |
| 2006/0107190 | A1 * | 5/2006 | Zhang ........................... | 714/784 |
| 2008/0168336 | A1 * | 7/2008 | Shen et al. .................... | 714/784 |
| 2009/0055716 | A1 * | 2/2009 | Hsu .............................. | 714/784 |
| 2010/0115381 | A1 * | 5/2010 | Truong et al. ................ | 714/782 |
| 2010/0131807 | A1 * | 5/2010 | Truong et al. ................ | 714/704 |
| 2010/0131831 | A1 * | 5/2010 | Weingarten et al. ......... | 714/782 |
| 2010/0174970 | A1 * | 7/2010 | Goldberg ..................... | 714/785 |
| 2010/0257433 | A1 * | 10/2010 | Weingarten et al. ......... | 714/782 |

FOREIGN PATENT DOCUMENTS

CN  101122468 A  2/2008

* cited by examiner

*Primary Examiner* — Albert Decady
*Assistant Examiner* — Justin R Knapp
(74) *Attorney, Agent, or Firm* — Wang Law Firm, Inc.; Li K. Wang; Stephen Hsu

(57) ABSTRACT

The invention provides a method for decoding an error correction code. First, an error syndrome of the error correction code is calculated. A plurality of coefficients of an error locator polynomial of the error correction code is then sequentially determined according to the error syndrome. When a new coefficient of the error locator polynomial is determined, it is also determined whether the new determined coefficient is equal to zero. When the new determined coefficient is equal to zero, a speculated error locator polynomial is built according to a plurality of low-order-term coefficients of the error locator polynomial, wherein the orders of the low-order-term coefficients are lower than that of the new determined coefficient. A Chien search is then performed to determine a plurality of roots of the speculated error locator polynomial. The error correction code is then corrected according to the roots of the speculated error locator polynomial.

17 Claims, 7 Drawing Sheets his application claims the benefit of U.S. Provisional Application No. 61/149,378, filed on Feb. 3, 2009, the entirety of which is incorporated by reference herein.

METHOD AND CIRCUIT FOR DECODING AN ERROR CORRECTION CODE

CROSS REFERENCE TO RELATED APPLICATIONS

This application claims the benefit of U.S. Provisional Application No. 61/149,378, filed on Feb. 3, 2009, the entirety of which is incorporated by reference herein.

This Application claims priority of Taiwan Patent Application No. 98111798, filed on Apr. 9, 2009, the entirety of which is incorporated by reference herein.

BACKGROUND OF THE INVENTION

1. Field of the Invention

The invention relates to error correction codes, and more particularly to decoding error correction codes.

2. Description of the Related Art

Error correction codes are used for correcting data errors. Communication system data is often encoded into an error correction code before the data is transmitted by a transmitter. When a receiver receives the error correction code, the receiver can correct data errors generated during the transmission process to recover the original data by decoding the error correction code. Similarly, data storage system data is often encoded into an error correction code before the data is stored in a storage medium. When the data stored in the storage medium is damaged, the original data can also be recovered by decoding the error correction code. A Bose, Ray-Chaudhuri, and Hocquenghem (BCH) code and a Reed-Solomon (RS) code are familiar error correction codes. The BCH code is commonly used for error correction in flash memory storage, and the RS code is commonly used for error correction in optical storage media.

When a data storage system retrieves data from a storage medium, because the data is stored in an error correction code form, the data storage system must decode the error correction code form to recover the original data. Referring to FIG. 1, a flowchart of a conventional method 100 for decoding an error correction code is shown. The error correction code is assumed to be a BCH code for example. First, a decoding circuit receives the BCH code retrieved from a storage medium (step 102). The decoding circuit then calculates an error syndrome of the BCH code (step 104). The decoding circuit then determines whether the error syndrome is equal to zero (step 106). If so, the BCH code has no errors, and no correction is required. Otherwise, the non-zero error syndrome indicates that the BCH code is erroneous. The decoding circuit therefore must correct the BCH code.

The decoding circuit first calculates a plurality of coefficients of an error locator polynomial of the BCH code according to the error syndrome (step 108). The coefficients is calculated via a loop, wherein each cycle of the loop generates one of the coefficients, and the coefficients are thereby sequentially generated from low-order-term coefficients to high-order-term coefficients. The loop continues until a highest-order-term coefficient is generated (step 110), so that an entire set of the coefficients are obtained to establish the error polynomial. The decoding circuit then performs a Chien search to determine a plurality of roots of the error locator polynomial (step 112). The roots of the error locator polynomial indicates the error bit locations in the BCH code. The decoding circuit therefore can correct the BCH code according to the roots of the error locator polynomial (step 114), and a recovered BCH code without errors is therefore obtained.

Referring to FIG. 2, a schematic diagram of timings for decoding an error correction code according to the conventional method 100 is shown. At time $t_a$, the decoding circuit starts to calculate the error syndrome of the error correction code (step 202). Calculation of the error syndrome requires a time period $T_1$. At time $t_b$, the decoding circuit starts to calculate the coefficients of the error locator polynomial of the error correction code (step 204), and the calculation of the coefficients requires a time period $T_2$. At time $t_c$, the decoding circuit starts to perform a Chien search to determine roots of the error locator polynomial (step 206), and performing of the Chien search requires a time period $T_3$. The entire decoding process of the error correction code therefore requires a total time period of $(T_1+T_2+T_3)$.

Decoding of an error correction code is a requisite process for a receiver of a communication system and a data storage system such as an optical disk drive or a flash memory controller. If the time period required by decoding of an error correction code is reduced, performance of the communication system or the data storage system is improved. It is difficult however, to reduce the time period $T_1$ required by calculation of the error syndrome, the time period $T_2$ required by calculation of the coefficients of the error locator polynomial, and the time period $T_3$ required by performing of the Chien search. A method for decoding an error correction code with a reduced time period to improve the performance of a communication system or a data storage system is therefore required.

BRIEF SUMMARY OF THE INVENTION

The invention provides a method for decoding an error correction code. First, an error syndrome of the error correction code is calculated. A plurality of coefficients of an error locator polynomial of the error correction code is then sequentially determined according to the error syndrome. When a new coefficient of the error locator polynomial is determined, it is also determined whether the new determined coefficient is equal to zero. When the new determined coefficient is equal to zero, a speculated error locator polynomial is built according to a plurality of low-order-term coefficients of the error locator polynomial, wherein the orders of the low-order-term coefficients are lower than that of the new determined coefficient. A Chien search is then performed to determine a plurality of roots of the speculated error locator polynomial. The error correction code is then corrected according to the roots of the speculated error locator polynomial.

The invention also provides a method for decoding an error correction code. First, an error syndrome of the error correction code is calculated. A plurality of coefficients of an error locator polynomial of the error correction code are then sequentially determined according to the error syndrome. When the coefficients of the error locator polynomial have not been totally determined, a Chien search is performed to determine a plurality of roots of a speculated error locator polynomial, wherein the speculated error locator polynomial is built according to the determined coefficients of the error locator polynomial. The error correction code is then corrected according to the roots of the speculated error locator polynomial.

The invention also provides a decoding circuit for decoding an error correction code. In one embodiment, the decoding circuit comprises an error syndrome calculation module, an error locator polynomial determination module, a control module, and a Chien search module. The error syndrome calculation module calculates an error syndrome of the error correction code. The error locator polynomial determination module sequentially determines a plurality of coefficients of an error locator polynomial of the error correction code according to the error syndrome when the error syndrome is not equal to zero. When a new coefficient of the error locator polynomial is determined by the error locator polynomial determination module, the control module determines whether the new determined coefficient is equal to zero, and generates a trigger signal when the new determined coefficient is equal to zero. When the Chien search module receives the trigger signal from the control module, the Chien search module builds a speculated error locator polynomial according to a plurality of low-order-term coefficients of the coefficients, and performs a Chien search to determine a plurality of roots of the speculated error locator polynomial for correcting the error correction code, wherein the orders of the low-order-term coefficients are lower than that of the new determined coefficient.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
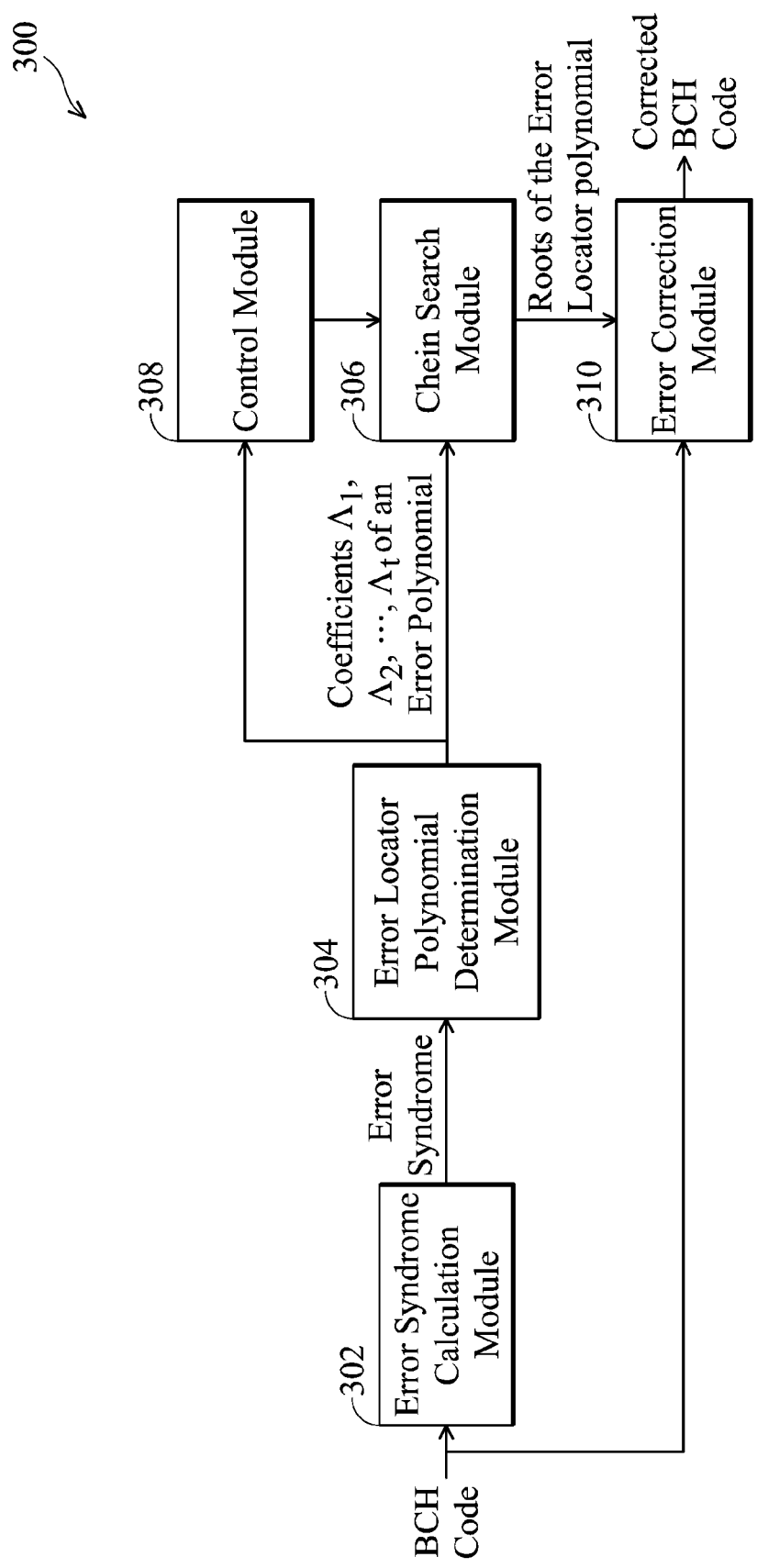
FIG. 3 is a block diagram of a decoding circuit for decoding an error correction code according to the invention.
Figure 4:
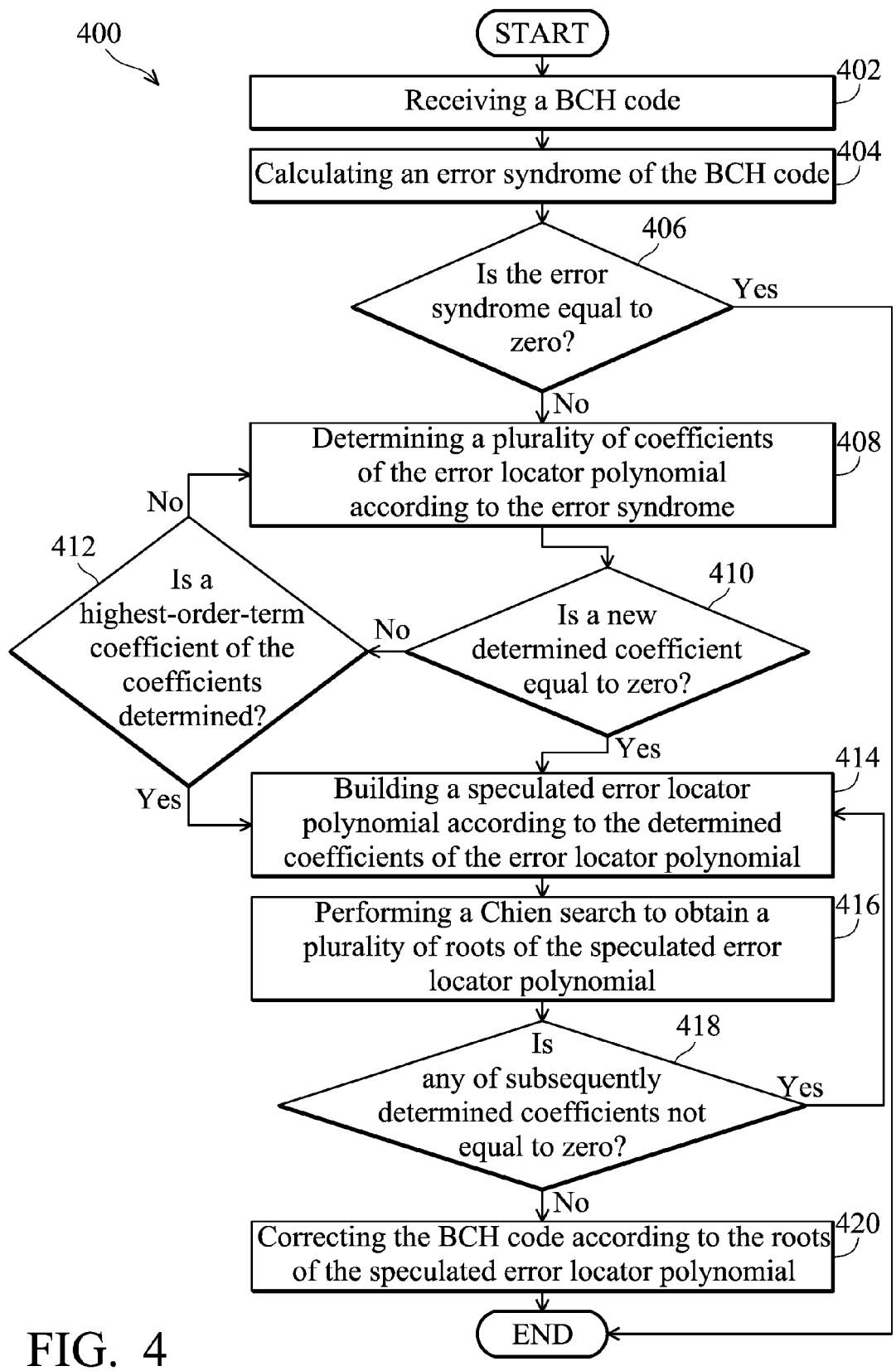
FIG. 4 is a flowchart of a method for decoding an error correction code according to the invention.

Referring to FIG. 3, a block diagram of a decoding circuit 300 for decoding an error correction code according to the invention is shown. In one embodiment, the decoding circuit 300 comprises an error syndrome calculation module 302, an error locator polynomial determination module 304, a Chien search module 306, a control module 308, and an error correction module 310. Referring to FIG. 4, a flowchart of a method 400 for decoding an error correction code according to the invention is shown. The decoding circuit 300 operates according to method 400 to decode a BCH code. The error correction code is assumed to be a BCH code for example, but the method 400 is also applicable to decoding an RS code. The time period required by decoding an error correction code according to the method 400 is reduced in comparison with the conventional method 400, thereby improving performance of the decoding circuit 300.

First, the error syndrome calculation module 302 receives a BCH code (step 402). The error syndrome calculation module 302 then calculates an error syndrome of the BCH code (step 404). The error syndrome calculation module 302 then determines whether the error syndrome is equal to zero (step 406). If so, no errors are determined to have occurred in the BCH code, and no correction is required. If not, it is determined that the BCH code comprises error bits and requires correction. Thus, when the error syndrome is not equal to zero, the error syndrome calculation module 302 delivers the error syndrome to the error locator polynomial determination module 304 to determine the error locator polynomial of the BCH code.

The error locator polynomial determination module 304 then sequentially determines a plurality of coefficients $\Lambda_1$, $\Lambda_2, \ldots, \Lambda_t$ of the error locator polynomial according to the error syndrome (step 408). In one embodiment, determination of the coefficients is from a first-order-term coefficient $\Lambda_1$ of the error locator polynomial to a highest-order-term coefficient $\Lambda_t$. Each time when the error locator polynomial determination module 304 completes calculation of a loop cycle, the error locator polynomial determination module 304 determines an ith-order-term coefficient $\Lambda_i$ of the error locator polynomial. The error locator polynomial determination module 304 continues calculation of the coefficients until all of the coefficients $\Lambda_1, \Lambda_2, \ldots, \Lambda_t$ of the error locator polynomial are determined. When all of the coefficients $\Lambda_1$, $\Lambda_2, \ldots, \Lambda_t$ of the error locator polynomial are determined, the error locator polynomial is built according to the following algorithm:

$$1+\Lambda_1 x+\Lambda_2 x^2+\ldots+\Lambda_i x^i+\ldots+\Lambda_t x^t.$$

Figure 1:
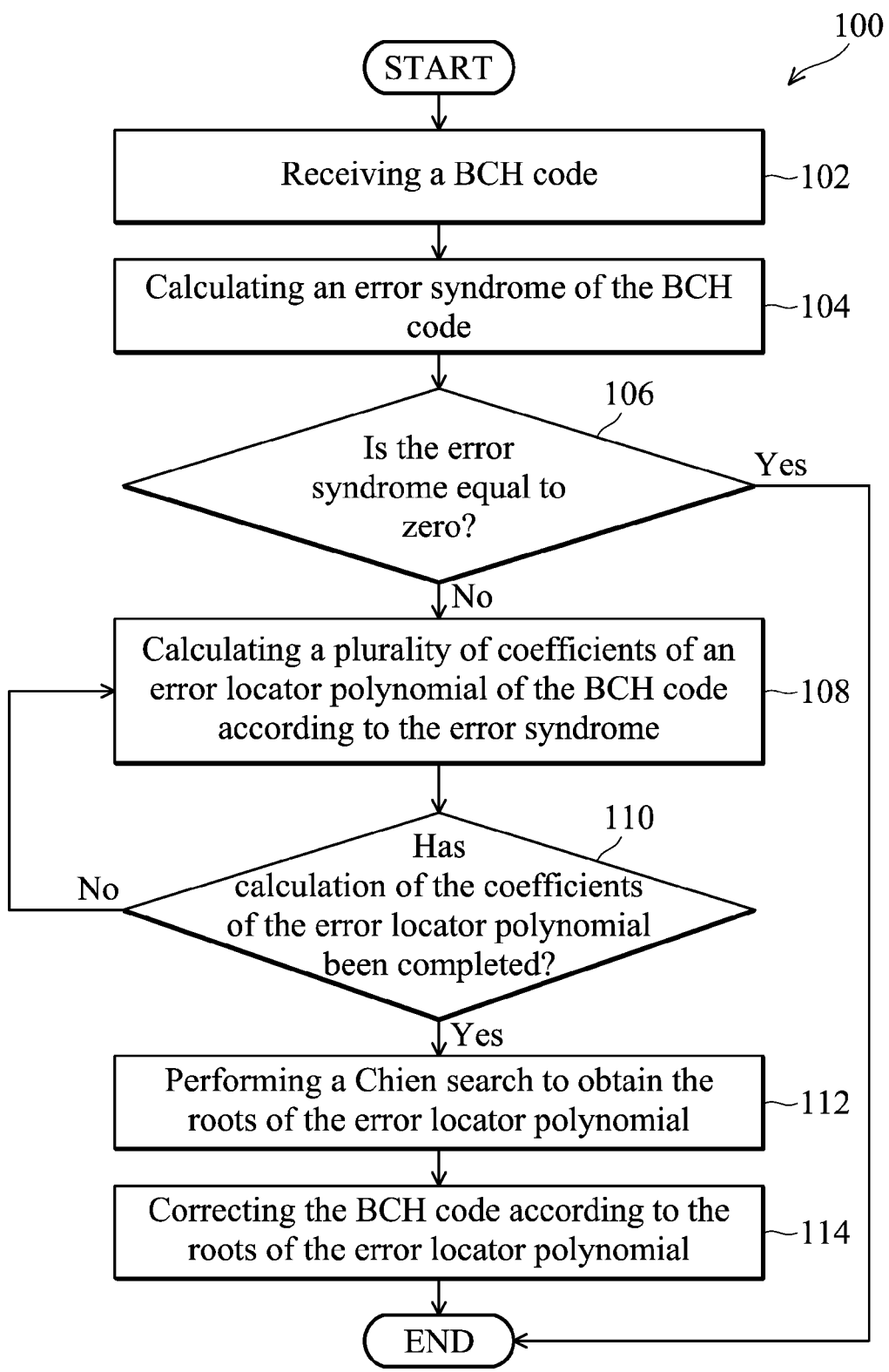
FIG. 1 is a flowchart of a conventional method for decoding an error correction code.
Figure 2:
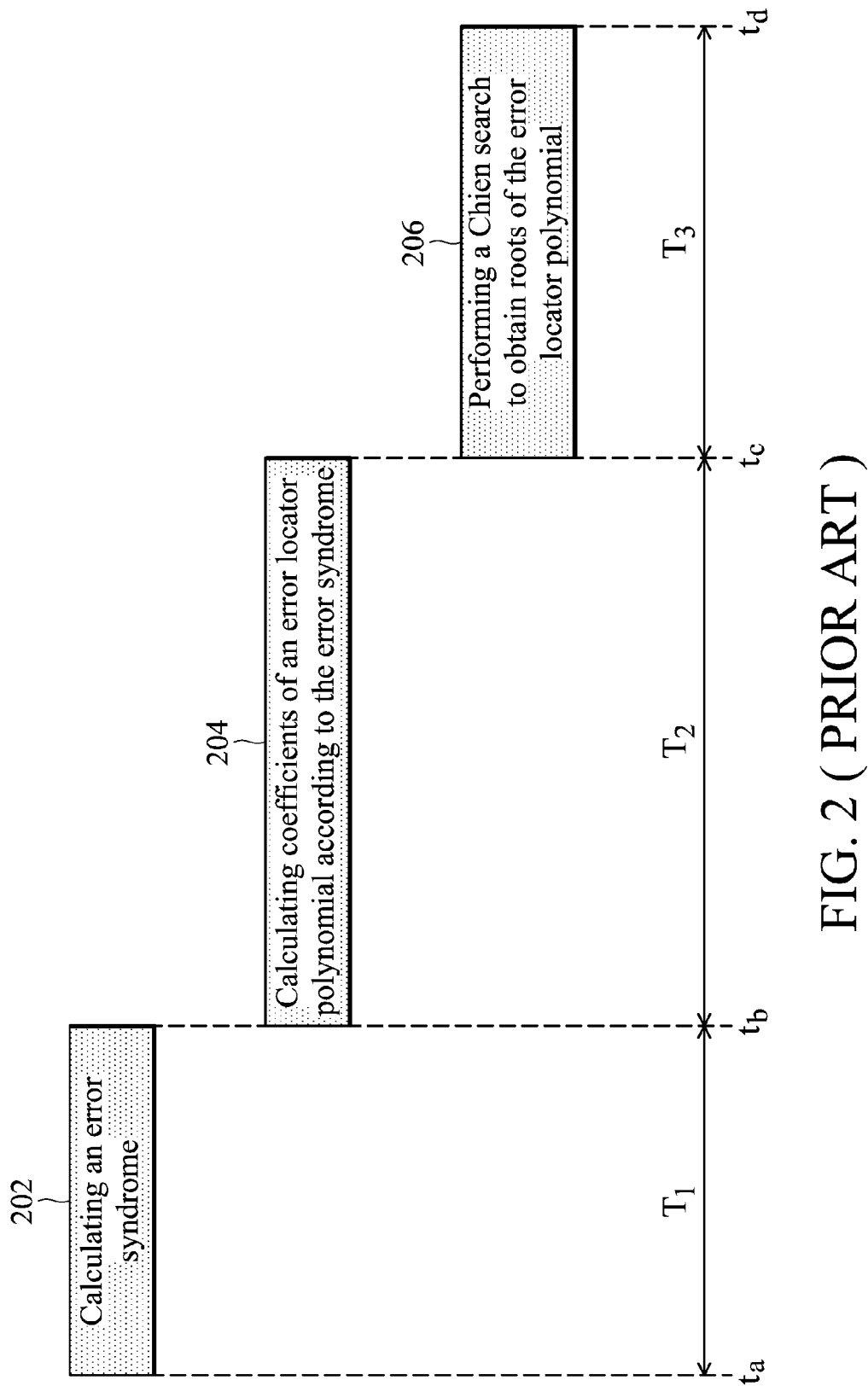
FIG. 2 is a schematic diagram of timings for decoding an error correction code according to the conventional method shown in FIG. 1.

According to the conventional method 100 shown in FIG. 1, a Chien search is performed to determine roots of the error locator polynomial after all of the coefficients $\Lambda_1, \Lambda_2, \ldots, \Lambda_t$ of the error locator polynomial are determined. According to the method 400 provided by the invention, a Chien search, however, is performed before all of the coefficients $\Lambda_1$, $\Lambda_2, \ldots, \Lambda_t$ of the error locator polynomial are completely determined. Thus, the total time of the decoding process is reduced in comparison with that of the conventional decoding process.

First, when the error locator polynomial determination module 304 determines a new ith-order-term coefficient $\Lambda_i$ of the error locator polynomial ($i \geq 2$), the control module 308 determines whether the new determined coefficient $\Lambda_i$ is equal to zero (step 410). If so, the control module 308 sends a trigger signal to the Chien search module 306 to enable the Chien search module 306 to start performing a Chien search according to the determined coefficients $\Lambda_1, \Lambda_2, \ldots, \Lambda_i$. Because the error locator polynomial determination module 304 has not yet determined all of the coefficients $\Lambda_1$, $\Lambda_2, \ldots, \Lambda_t$ of the error locator polynomial, starting the Chien search before completion reduces total time required by the decoding process. If the new determined coefficient $\Lambda_i$ is not equal to zero, the control module 308 determines whether the new determined coefficient $\Lambda_i$ is a highest-order-term coefficient $\Lambda_t$ of the error locator polynomial (step 412). If so, the control module 308 sends a trigger signal to the Chien search module 306 to enable the Chien search module 306 to perform a Chien search according to all coefficients $\Lambda_1$, $\Lambda_2, \ldots, \Lambda_t$ of the error locator polynomial.

When the Chien search module 306 receives a trigger signal from the control module 308, the Chien search module 306 builds a speculated error polynomial (or named roughly-estimated error polynomial) according to the determined coefficients of the error locator polynomial (step 414). Assume that the error locator polynomial determination module 304 has determined coefficients $\Lambda_1, \Lambda_2, \ldots, \Lambda_k$ of the error locator polynomial, the Chien search module 306 builds the speculated error polynomial according to the following algorithm:

$$1+\Lambda_1 x+\Lambda_2 x^2+\ldots+\Lambda_j x^j+\ldots+\Lambda_k x^k.$$

The Chien search module 306 then performs a Chien search to determine a plurality of roots of the speculated error locator polynomial (step 416). When the Chien search module 306 performs the Chien search, the error locator polynomial determination module 304 continues to determine the coefficients of the error locator polynomial, and the control module 308 determines whether a new determined coefficient generated by the error locator polynomial determination module 304 is zero. If the control module 308 determines that any of subsequently determined coefficients is not equal to zero (step 418), the control module 308 directly generates a resetting signal. When the Chien search module 306 receives the resetting signal, the Chien search module 306 builds a new speculated error locator polynomial according to the updated determined coefficients (step 414), and performs a Chien search to determine the roots of the new speculated error locator polynomial (step 416). Finally, because the roots of the speculated error locator polynomial or the new speculated error locator polynomial indicate the location of error bits in the BCH code, the error correction module 310 corrects the BCH code according to the roots of the speculated error locator polynomial or the new speculated error locator polynomial to obtain a corrected BCH code without errors.

Figure 5:
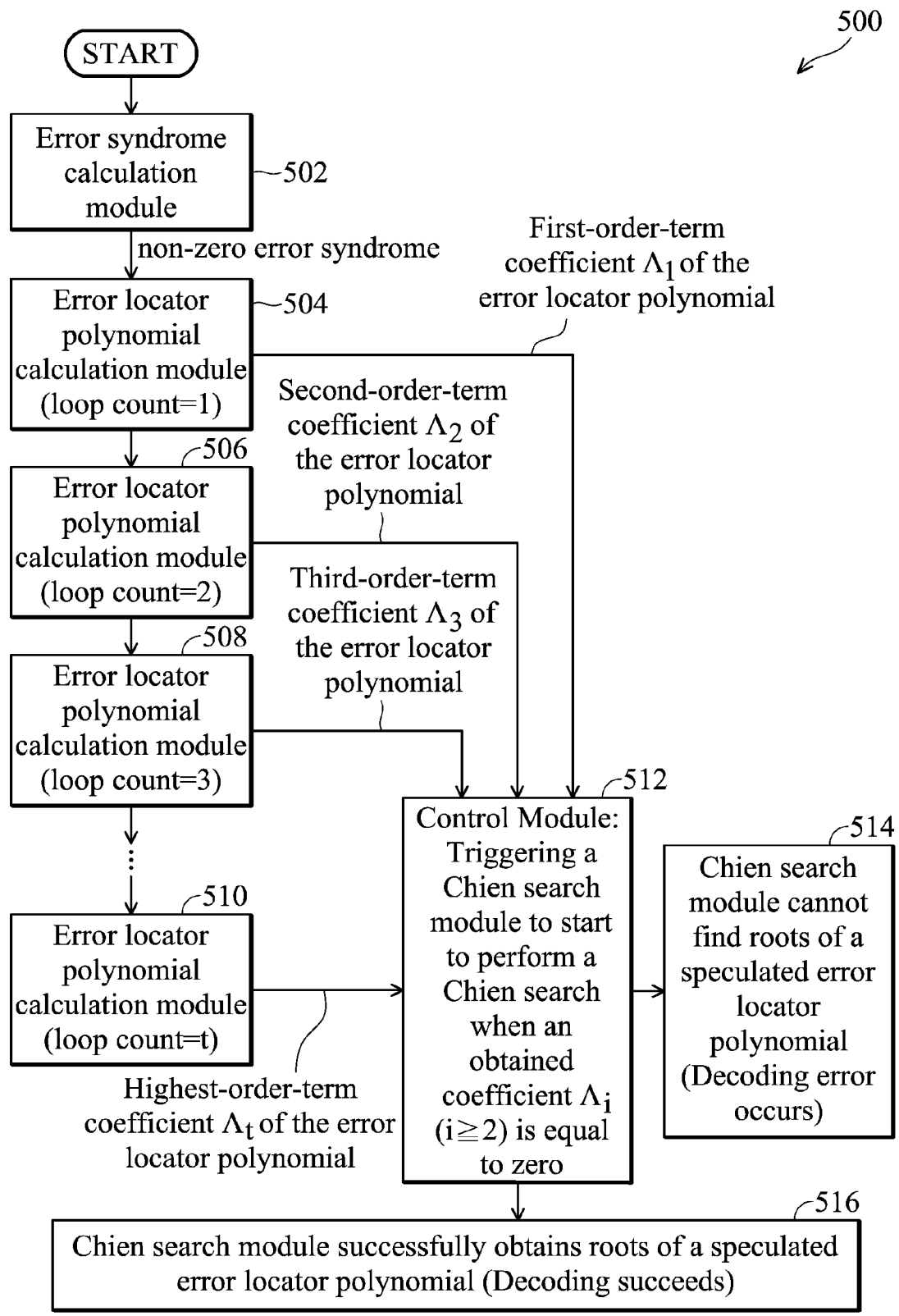
FIG. 5 is a schematic diagram of operations of the decoding circuit shown in FIG. 3 according to the invention.

Referring to FIG. 5, a schematic diagram of operation of the decoding circuit 300 according to the invention is shown. The error syndrome calculation module 302 first generates an error syndrome of a BCH code (step 502). The error locator polynomial determination module 304 then sequentially generates a first-order-term coefficient $\Lambda_1$ (step 504), a second-order-term coefficient $\Lambda_2$ (step 506), a third-order-term coefficient $\Lambda_3$ (step 508), and a highest-order-term coefficient $\Lambda_t$ of the error locator polynomial (step 510). When the error locator polynomial determination module 304 determines the coefficients of the error locator polynomial, the control module 308 determines whether an ith-order-term coefficient $\Lambda_i$ ($i \geq 2$) is equal to zero. If so, the control module 308 directs the Chien search module 306 to start performing a Chien search (step 512). After the Chien search module 306 starts performing the Chien search, if the control module 308 determines that a subsequently determined higher-order-term coefficient $\Lambda_j$ ($2<j\leq t$) of the error locator polynomial is not equal to zero, the control module 308 resets the Chien search module 306 and directs the Chien search module 306 to restart a Chien search (step 512). Finally, if the Chien search module 306 cannot determine roots of the speculated error locator polynomial, a decoding error is identified (step 514). Otherwise, the Chien search module 306 successfully determines roots of the speculated error locator polynomial, and the number of the roots is equal to the order of the speculated error locator polynomial, indicating that the decoding is completed without errors (step 516).

Figure 6:
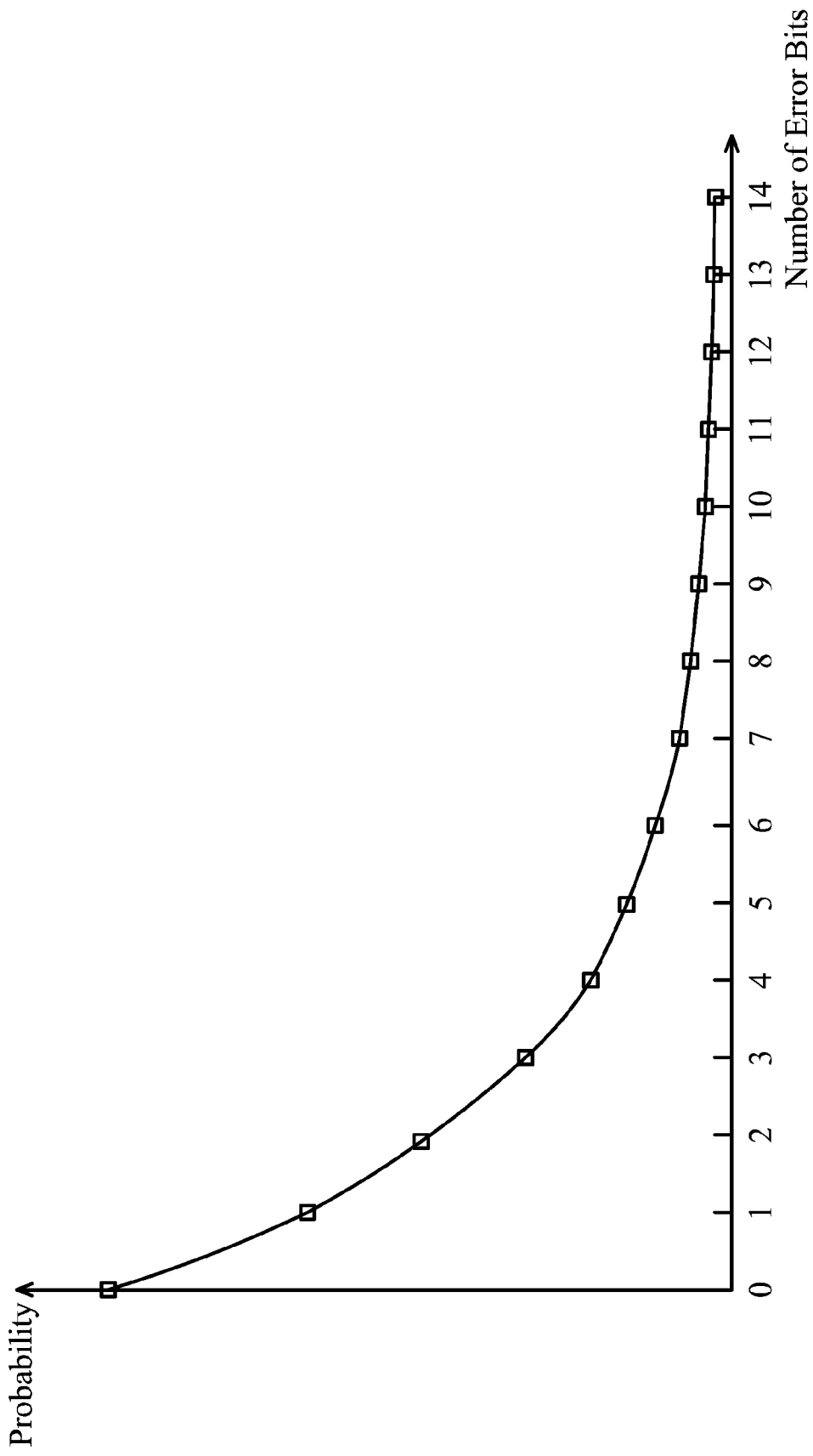
FIG. 6 is a schematic diagram of a probability distribution of an error bit number of an error correction code.

Referring to FIG. 6, a schematic diagram of a probability distribution of an error bit number of an error correction code is shown. As shown in FIG. 6, when the number of the error bits increase, the probability corresponding to the error bits decreases. In other words, most error correction codes comprise only a small number of error bits. Because a number of the roots of an error locator polynomial is equal to the number of the error bits in the error correction code, the error locator polynomial determination module 304 often determines high-order-term coefficients of an error locator polynomial to be equal to zero. In other words, the conventional decoding method 200 requires much time to determine high-order-term coefficients of an error locator polynomial. The method 400 provided by the invention, however, starts performing a Chien search when a zero coefficient of an error locator polynomial is determined. Because the higher-order-term coefficients of the error locator polynomial are probably equal to zero, the decoding circuit 300 according to the invention effectively corrects the errors of the error correction code in most cases, thus reducing a required time period of the decoding circuit 300.

Figure 7:
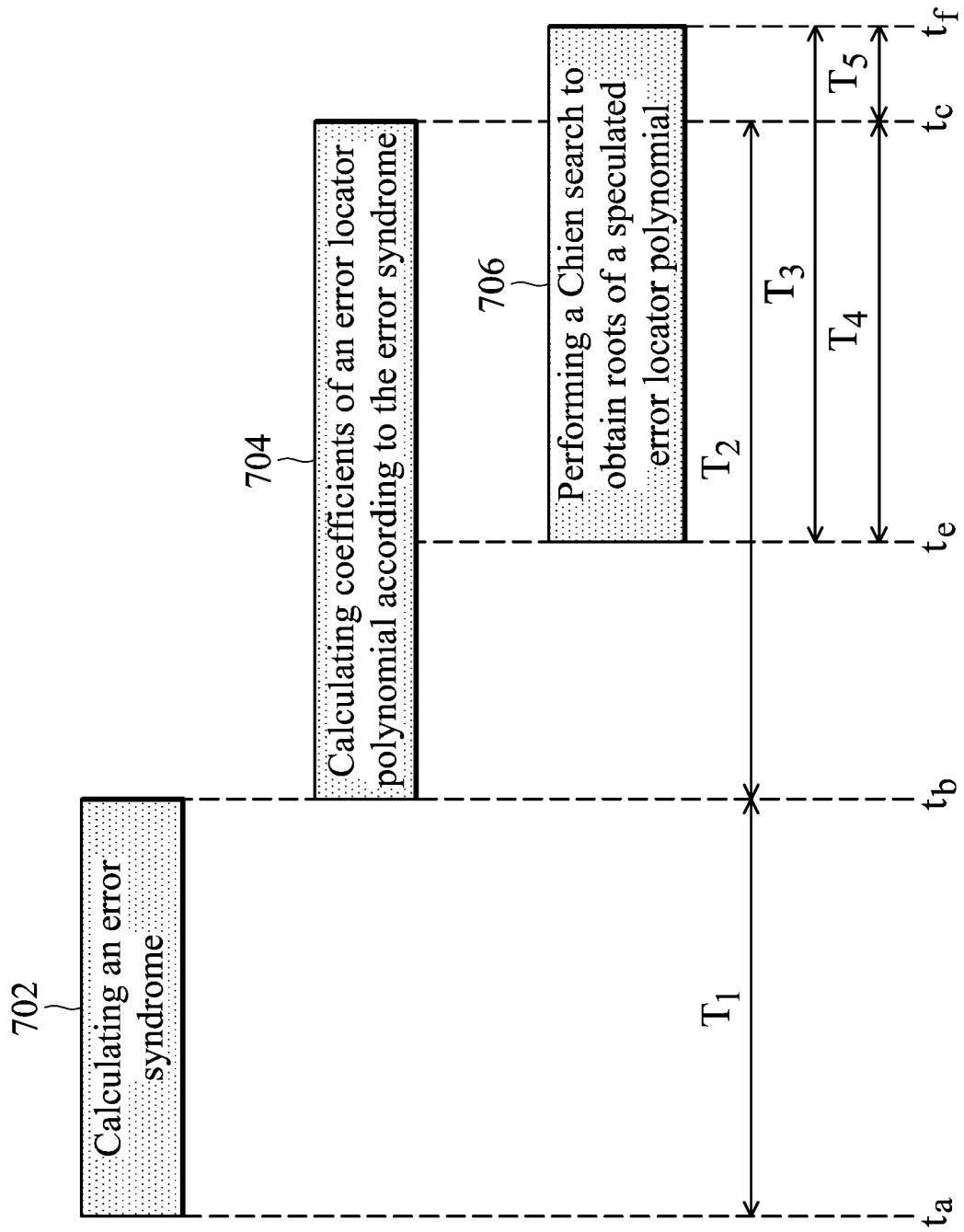
FIG. 7 is a schematic diagram of decoding timings of the decoding circuit according to the invention.

Referring to FIG. 7, a schematic diagram of decoding timings of the decoding circuit 300 according to the invention is shown. At time $t_a$, the decoding circuit 300 starts calculating the error syndrome of an error correction code (step 702). Calculation of the error syndrome requires a time period $T_1$. At time $t_b$, the decoding circuit 300 starts calculating the coefficients of an error locator polynomial of the error correction code (step 704), and the calculation of the coefficients requires a time period $T_2$. At time $t_e$ prior to an end time $t_c$ of the coefficient calculation step 704, the decoding circuit 300 starts performing a Chien search to determine roots of a speculated error locator polynomial (step 706) for error correction, and performing of the Chien search requires a time period $T_3$. The entire decoding process of the error correction code therefore requires a total time period of $(T_1+T_2+T_5)$. In comparison with the total decoding time period of $(T_1+T_2+T_3)$ required by the conventional decoding method 100, the total time period $(T_1+T_2+T_5)$ required by the invention is reduced by a time period $T_4$, thus improving performance of the decoding circuit 300 provided by the invention.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for decoding an error correction code, comprising:
    calculating an error syndrome of the error correction code;
    sequentially determining a plurality of coefficients of an error locator polynomial of the error correction code according to the error syndrome;
    when a new coefficient of the error locator polynomial is determined as a newly-determined coefficient, determining whether the newly-determined coefficient is equal to zero;
    when the newly-determined coefficient is equal to zero and is of an order greater than or equal to 2, building a roughly-estimated error locator polynomial according to a plurality of low-order-term coefficients of the error locator polynomial, wherein the low-order-term coefficients are of orders lower than that of the newly-determined coefficient; and
    performing a Chien search to determine a plurality of roots of the roughly-estimated error locator polynomial for correction of the error correction code and thereby to speed up decoding of the error correction code.

2. The method as claimed in claim 1, wherein the method further comprises:
    when a plurality of high-order-term coefficients with orders higher than that of the newly-determined coefficient are determined, determining whether the high-order-term coefficients are equal to zero;

when any of the high-order-term coefficients is not equal to zero, building a new roughly-estimated error locator polynomial according to the high-order-term coefficients and the low-order-term coefficients;

performing a Chien search to determine a plurality of roots of the new roughly-estimated error locator polynomial; and correcting the error correction code according to the roots of the new roughly-estimated error locator polynomial.

3. The method as claimed in claim 1, wherein the method further comprises:

when a highest-order-term coefficient of the error locator polynomial is determined, building the error locator polynomial according to all the coefficients of the error locator polynomial, wherein one of the coefficients is the highest-order-term coefficient;

performing a Chien search to determine a plurality of roots of the error error locator polynomial; and correcting the error correction code according to the roots of the error error locator polynomial.

4. The method as claimed in claim 1, wherein an order for determination of the plurality of coefficients of the error locator polynomial is from a first-order-term coefficient to a highest-term coefficient.

5. The method as claimed in claim 1, wherein building of the roughly-estimated error locator polynomial is according to the following algorithm:

$$1+\Lambda_1 x+\Lambda_2 x^2+\ldots+\Lambda_i x^i+\ldots+\Lambda_k x^k,$$

wherein $\Lambda_1 \sim \Lambda_k$ are the low-order-term coefficients.

6. The method as claimed in claim 1, wherein the method further comprises:

after the roots of the roughly-estimated error locator polynomial are determined, determining whether the number of the roots of the roughly-estimated error locator polynomial is equal to the order of the roughly-estimated error locator polynomial; and when the number of the roots of the roughly-estimated error locator polynomial is equal to the order of the roughly-estimated error locator polynomial, correcting the error correction code according to the roots of the roughly-estimated error locator polynomial.

7. The method as claimed in claim 1, wherein the method further comprises:

after the error syndrome is calculated, determining whether the error syndrome is equal to zero; and starting determination of the coefficients of the error locator polynomial only when the error syndrome is not equal to zero.

8. A method for decoding an error correction code, comprising:

calculating an error syndrome of the error correction code;

sequentially determining a plurality of coefficients of an error locator polynomial of the error correction code according to the error syndrome; and when the coefficients of the error locator polynomial have not been totally determined, performing a Chien search to determine a plurality of roots of a roughly-estimated error locator polynomial for correction of the error correction code and thereby to speed up decoding of the error correction code, error locator polynomial, wherein the roughly-estimated error locator polynomial is built according to the determined coefficients of the error locator polynomial, the determined coefficients are low-order-term coefficients of the error locator polynomial with orders lower than that of a newly-determined zero coefficient of the error locator polynomial, and the newly-determined zero coefficient is of an order greater than or equal to 2.

9. The method as claimed in claim 8, wherein the roughly-estimated error locator polynomial is determined according to the following algorithm:

$$1+\Lambda_1 x+\Lambda_2 x^2+\ldots+\Lambda_i x^i+\ldots+\Lambda_k x^k,$$

wherein $\Lambda_1 \sim \Lambda_k$ are the low-order-term coefficients.

10. The method as claimed in claim 8, wherein the method further comprises:

after the roots of the roughly-estimated error locator polynomial are determined, determining whether the number of the roots of the roughly-estimated error locator polynomial is equal to the order of the roughly-estimated error locator polynomial; and when the number of the roots of the roughly-estimated error locator polynomial is equal to the order of the roughly-estimated error locator polynomial, correcting the error correction code according to the roots of the roughly-estimated error locator polynomial.

11. A decoding circuit for decoding an error correction code, comprising:

an error syndrome calculation module, calculating an error syndrome of the error correction code;

an error locator polynomial determination module, sequentially determining a plurality of coefficients of an error locator polynomial of the error correction code according to the error syndrome when the error syndrome is not equal to zero;

a control module, when a new coefficient of the error locator polynomial is determined as a newly-determined coefficient by the error locator polynomial determination module, determining whether the newly-determined coefficient is equal to zero, and generating a trigger signal when the newly-determined coefficient is equal to zero and is of an order greater than or equal to 2; and a Chien search module, when receiving the trigger signal from the control module, building a roughly-estimated error locator polynomial according to a plurality of low-order-term coefficients of the coefficients, and performing a Chien search to determine a plurality of roots of the roughly-estimated error locator polynomial for correcting the error correction code;

wherein the low-order-term coefficients are of orders lower than that of the newly-determined coefficient.

12. The decoding circuit as claimed in claim 11, wherein the decoding circuit further comprises:

an error correction module, correcting the error correction code according to the roots of the roughly-estimated error locator polynomial.

13. The decoding circuit as claimed in claim 11, wherein when the error locator polynomial determination module determines a plurality of high-order-term coefficients with orders higher than that of the newly-determined coefficient, the control module determines whether the high-order-term coefficients are equal to zero, and generates a resetting signal when any of the high-order-term coefficients is not equal to zero, and when the Chien search module receives the resetting signal, the Chien search module builds a new roughly-estimated error locator polynomial according to the high-order-term coefficients and the low-order-term coefficients, and performs a Chien search to determine a plurality of roots of the new roughly-estimated error locator polynomial for correcting the error correction code.

14. The decoding circuit as claimed in claim 11, wherein when the error locator polynomial determination module determines a highest-order-term coefficient of the error locator polynomial, the control module generates the trigger signal, and thereby the Chien search module builds the error locator polynomial according to all the coefficients of the error locator polynomial which contain the highest-order-term coefficient, and performs a Chien search to determine a plurality of roots of the error locator polynomial for correcting the error correction code.

15. The decoding circuit as claimed in claim 11, wherein the error locator polynomial determination module determines the plurality of coefficients of the error locator polynomial with an order from a first-order-term coefficient to a highest-term coefficient.

16. The decoding circuit as claimed in claim 11, wherein the Chien search module builds the roughly-estimated error locator polynomial according to the following algorithm:

$$1+\Lambda_1 x+\Lambda_2 x^2+\ldots+\Lambda_i x^i+\ldots+\Lambda_k x^k,$$

wherein $\Lambda A_1 \sim \Lambda_k$ are the low-order-term coefficients.

17. The decoding circuit as claimed in claim 12, wherein after the error locator polynomial determination module determines the roots of the roughly-estimated error locator polynomial, the Chien search module determines whether the number of the roots of the roughly-estimated error locator polynomial is equal to the order of the roughly-estimated error locator polynomial, and, the error correction module corrects the error correction code according to the roots of the roughly-estimated error locator polynomial only when the number of the roots of the roughly-estimated error locator polynomial is equal to the order of the roughly-estimated error locator polynomial.

* * * * *